US010021977B2

(12) United States Patent
Chen et al.

(10) Patent No.: US 10,021,977 B2
(45) Date of Patent: Jul. 17, 2018

(54) SLIDE RAIL ASSEMBLY AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

(*) Notice: Subject to any disclaimer, the term of this patent is extended or adjusted under 35 U.S.C. 154(b) by 10 days.

(21) Appl. No.: 15/007,490

(22) Filed: Jan. 27, 2016

(65) Prior Publication Data
US 2017/0042328 A1   Feb. 16, 2017

(30) Foreign Application Priority Data
Aug. 14, 2015   (TW) ............................. 104126668 A (51) Int. Cl.
A47B 88/40   (2017.01)
A47B 88/04   (2006.01)
H05K 7/14   (2006.01)
A47B 88/43   (2017.01)
(Continued)

(52) U.S. Cl.
CPC ............ *A47B 88/044* (2013.01); *A47B 88/43* (2017.01); *H05K 7/1489* (2013.01); *A47B 7/00* (2013.01); *A47B 88/40* (2017.01); *A47B 88/403* (2017.01)

(58) Field of Classification Search
CPC ......... A47F 7/00; A47B 88/00; A47B 88/044; A47B 88/0418; A47B 88/042; A47B 88/40; A47B 88/401; A47B 88/403; H05K 7/1489
USPC ........ 248/201, 298.1, 316.8, 220.21, 220.31, 248/220.41, 265.2, 265.3; 312/334.7, 312/333, 334.8, 334.46, 334.44, 330.1, 312/223.1, 265.1, 265.4, 319.1, 334.1, 312/334.4, 334.5
See application file for complete search history.

(56) References Cited

U.S. PATENT DOCUMENTS 7,192,103 B2   3/2007   Hamilton
7,357,362 B2 *  4/2008   Yang ..................... A47B 88/43
                                              248/220.22
(Continued)

FOREIGN PATENT DOCUMENTS

CN   102695396 B   12/2014

*Primary Examiner* — Nkeisha Smith
(74) *Attorney, Agent, or Firm* — Rosenberg, Klein & Lee (57) ABSTRACT

A slide rail assembly includes a rail member, first and second brackets, a blocking member, and an elastic member. The two brackets are mounted to the rail member and are detachably attached to first and second posts of a rack respectively. The blocking member is movably connected to the second bracket, which can remain at a first position with respect to the blocking member thanks to the elastic member. After the first bracket is detached from the first post, the rail member can be displaced, and thus move the blocking member, in a direction so that the second bracket is displaced from the first position to a second position with respect to the blocking member and separated from the second post.

9 Claims, 6 Drawing Sheets

(51) Int. Cl.
 *A47B 7/00* (2006.01)
 *A47B 88/403* (2017.01)

(56) References Cited

U.S. PATENT DOCUMENTS

| | | | | |
|---|---|---|---|---|
| 7,703,734 B2* | 4/2010 | Chen | ...................... | A47B 88/43 108/108 |
| 7,731,142 B2 | 6/2010 | Chen et al. | | |
| 7,988,246 B2* | 8/2011 | Yu | ......................... | A47B 88/43 211/175 |
| 8,146,756 B2 | 4/2012 | Brock et al. | | |
| 8,231,188 B1* | 7/2012 | Chen | ...................... | A47B 88/57 312/333 |
| 8,328,300 B2* | 12/2012 | Yu | ......................... | A47B 88/43 312/333 |
| 8,353,494 B2* | 1/2013 | Peng | ...................... | A47B 88/43 211/192 |
| 8,371,454 B2* | 2/2013 | Chen | .................... | H05K 7/1421 211/26 |
| 8,403,434 B2* | 3/2013 | Yu | ......................... | H05K 7/1489 248/244 |
| 8,408,506 B2* | 4/2013 | Yu | ......................... | A47B 88/43 248/219.1 |
| 8,770,528 B2* | 7/2014 | Chen | .................... | H05K 7/1421 211/26 |
| 8,807,351 B2* | 8/2014 | Lin | ........................ | A47B 88/43 211/26 |
| 8,931,860 B2* | 1/2015 | Fan | ...................... | H05K 7/1489 248/222.12 |
| 8,967,565 B2* | 3/2015 | Chen | ...................... | A47B 88/044 211/192 |
| 9,237,808 B2* | 1/2016 | Chen | ...................... | A47B 96/07 |
| 9,370,120 B2* | 6/2016 | Chen | ................... | A47B 96/025 |
| 9,402,475 B2* | 8/2016 | Gu | ......................... | A47B 88/044 |
| 9,526,338 B2* | 12/2016 | Chen | ................... | A47B 47/0058 |
| 2005/0156493 A1* | 7/2005 | Yang | ...................... | A47B 88/43 312/334.5 |
| 2008/0087781 A1* | 4/2008 | Chen | ...................... | A47B 88/43 248/224.8 |
| 2009/0309471 A1* | 12/2009 | Yu | ......................... | A47B 88/43 312/334.44 |
| 2010/0072153 A1* | 3/2010 | Chen | ...................... | H05K 7/1421 211/183 |
| 2012/0193489 A1* | 8/2012 | Yu | ......................... | H05K 7/1489 248/201 |
| 2014/0217049 A1* | 8/2014 | Chen | ................... | H05K 7/1489 211/195 |
| 2015/0084494 A1* | 3/2015 | Tonthat | ................. | H05K 7/183 312/333 |
| 2015/0173510 A1* | 6/2015 | Yu | ........................ | H05K 7/1489 384/22 |
| 2016/0029791 A1* | 2/2016 | Chen | ................... | H05K 7/1489 312/334.44 |
| 2017/0013959 A1 | 1/2017 | Chen et al. | | |

\* cited by examiner

United States Patent US 10,021,977 B2

SLIDE RAIL ASSEMBLY AND BRACKET DEVICE THEREOF

FIELD OF THE INVENTION

The present invention relates to a slide rail assembly and more particularly to a slide rail assembly which includes a bracket device that can be easily detached from a rack.

BACKGROUND OF THE INVENTION

Chinese Patent No. 102695396B discloses a slide rail tool-free mounting frame for a server. The slide rail tool-free mounting frame includes a pair of rack positioning posts (4) provided on a slide rail rear mounting frame (1) and a rack floating hook (2). The rack floating hook (2) includes a pair of hooks (203) respectively provided on a pair of wings (205). The pair of wings (205) are each provided with a slide guide sleeve (201) and are in fixed connection through an arch-shaped bent element (206). The slide rail rear mounting frame (1) is fixedly provided with two slide guide posts (101) which are respectively sleeved in the slide guide sleeves (201) and are in fixed connection through limit screws (7). A first return spring (6) is mounted around each slide guide sleeve (201) and between the corresponding wing (205) and limit screw (7). The slide rail rear mounting frame (1) is further provided with a floating pin hole (104) in which a floating pin (3) is placed. One end of the floating pin (3) is connected to the arch-shaped bent element (206) through the corresponding limit screw (7) while the other end of the floating pin (3) is a conical head (301) provided in the floating pin hole (104). A second return spring (5) is mounted around the floating pin (3) and between an end face of the conical head (301) and the corresponding limit screw (7).

According to the above arrangement, the floating pin (3) can be driven by an outer rail member of a slide rail to lock/release the slide rail rear mounting frame (1), wherein the outer rail member is housed in the rear mounting frame. The complicated structural composition, however, may compromise overall operability.

SUMMARY OF THE INVENTION

The present invention relates to a slide rail assembly which includes a bracket device readily detachable from a rack.

According to one aspect of the present invention, a slide rail assembly to be attached to a first post and a second post of a rack includes a rail member, a first bracket, a second bracket, a blocking member, and an elastic member. The first bracket is detachably attached to the first post of the rack. The second bracket is detachably attached to the second post of the rack and movably mounted to the rail member. The blocking member is movably connected to the second bracket. The elastic member is configured to provide an elastic force so that the second bracket can stay at a first position with respect to the blocking member. In the course in which the rail member is displaced in a certain direction after the first bracket is detached from the first post, the second bracket is displaced together with the rail member in the same direction, and after the blocking member is pressed against the second post, the second bracket is displaced from the first position to a second position with respect to the blocking member and is thus separated from the second post. Preferably, the elastic member is connected between the second bracket and the blocking member. Moreover, one of the second bracket and the blocking member preferably has a guiding portion of a predetermined length. The blocking member is movably connected to the second bracket by a connecting member mounted to the guiding portion, thereby enabling the second bracket to displace between the first position and the second position with respect to the blocking member according to the predetermined length of the guiding portion. Furthermore, the second bracket preferably includes a side plate movably mounted to the rail member, an end plate generally perpendicularly connected to the side plate, and at least one attaching member mounted to the end plate and configured to attach to a mounting hole in the second post.

According to another aspect of the present invention, a bracket device includes a bracket, a blocking member, and a connecting member. The blocking member is movably connected to the bracket. One of the blocking member and the bracket has a guiding portion of a predetermined length. The connecting member extends through the guiding portion to connect the bracket and the blocking member so that the bracket is displaceable between a first position and a second position with respect to the blocking member via the connecting member within the predetermined length of the guiding portion. Moreover, the bracket device preferably includes an elastic member for providing an elastic force and thereby enabling the bracket to stay at the first position with respect to the blocking member. Preferably, the bracket includes a side plate to which the blocking member is movably connected, an end plate generally perpendicularly connected to the side plate, and at least one attaching member mounted to the end plate. In some embodiments, the guiding portion is disposed on the blocking member, and the blocking member further includes a blocking portion corresponding to the end plate.

In some embodiments of either one of the foregoing aspects, the bracket (the second bracket) has a first contact portion, and the blocking member has a second contact portion. The first contact portion of the bracket (the second bracket) is configured to push the second contact portion of the blocking member, thereby tilting the blocking member by an angle with respect to the bracket (the second bracket). Preferably, one of the first contact portion and the second contact portion has a guiding surface for guiding the blocking member to tilt by an angle with respect to the bracket (the second bracket).

DETAILED DESCRIPTION OF THE INVENTION

Figure 1:
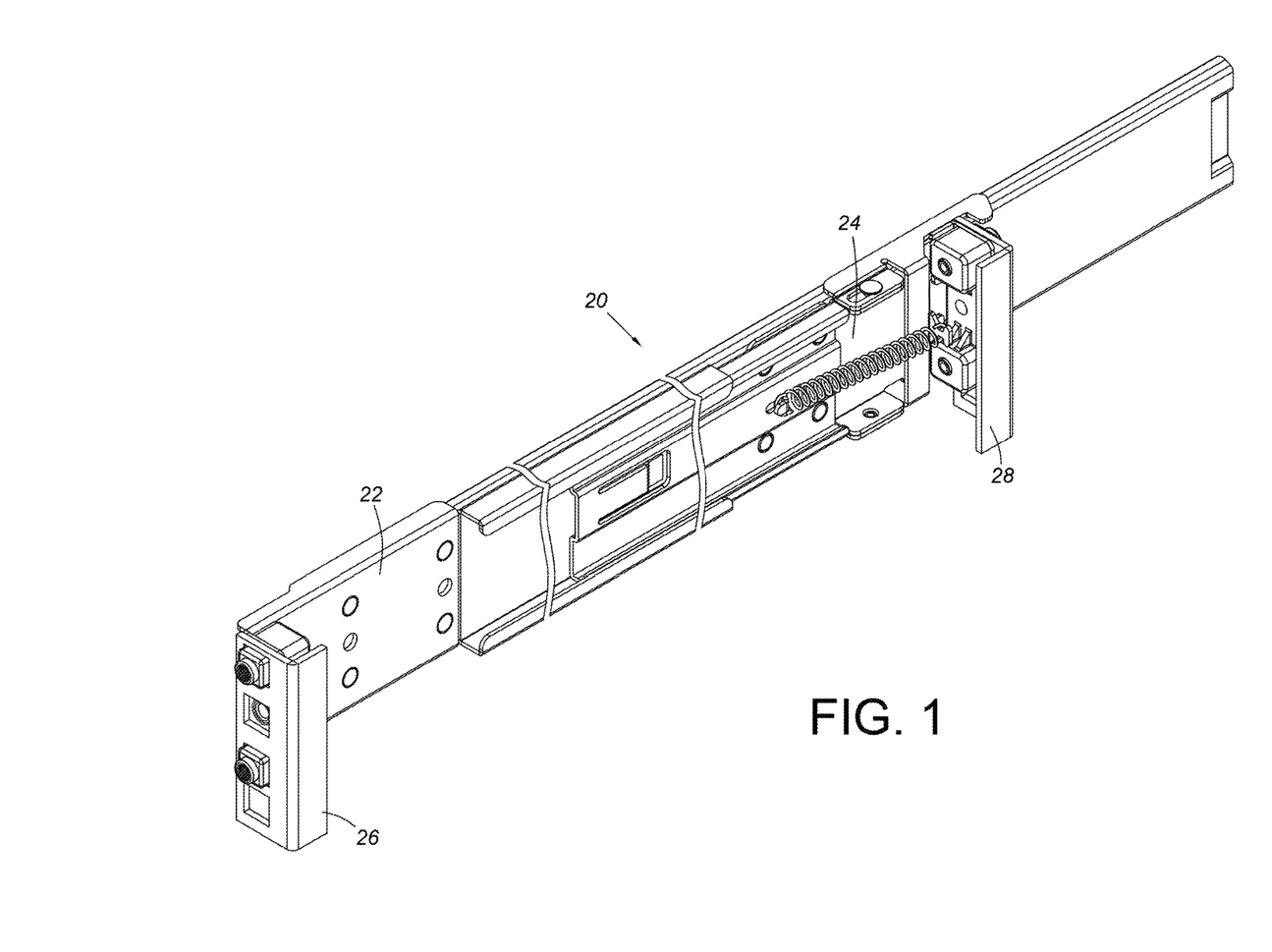
FIG. 1 is a perspective view in which the slide rail assembly in an embodiment of the present invention is attached to two posts of a rack via two brackets respectively.

Referring to FIG. 1, the slide rail assembly 20 in an embodiment of the present invention is detachably attached to a first post 26 and a second post 28 of a rack via a first bracket 22 and a second bracket 24 respectively.

Figure 2:
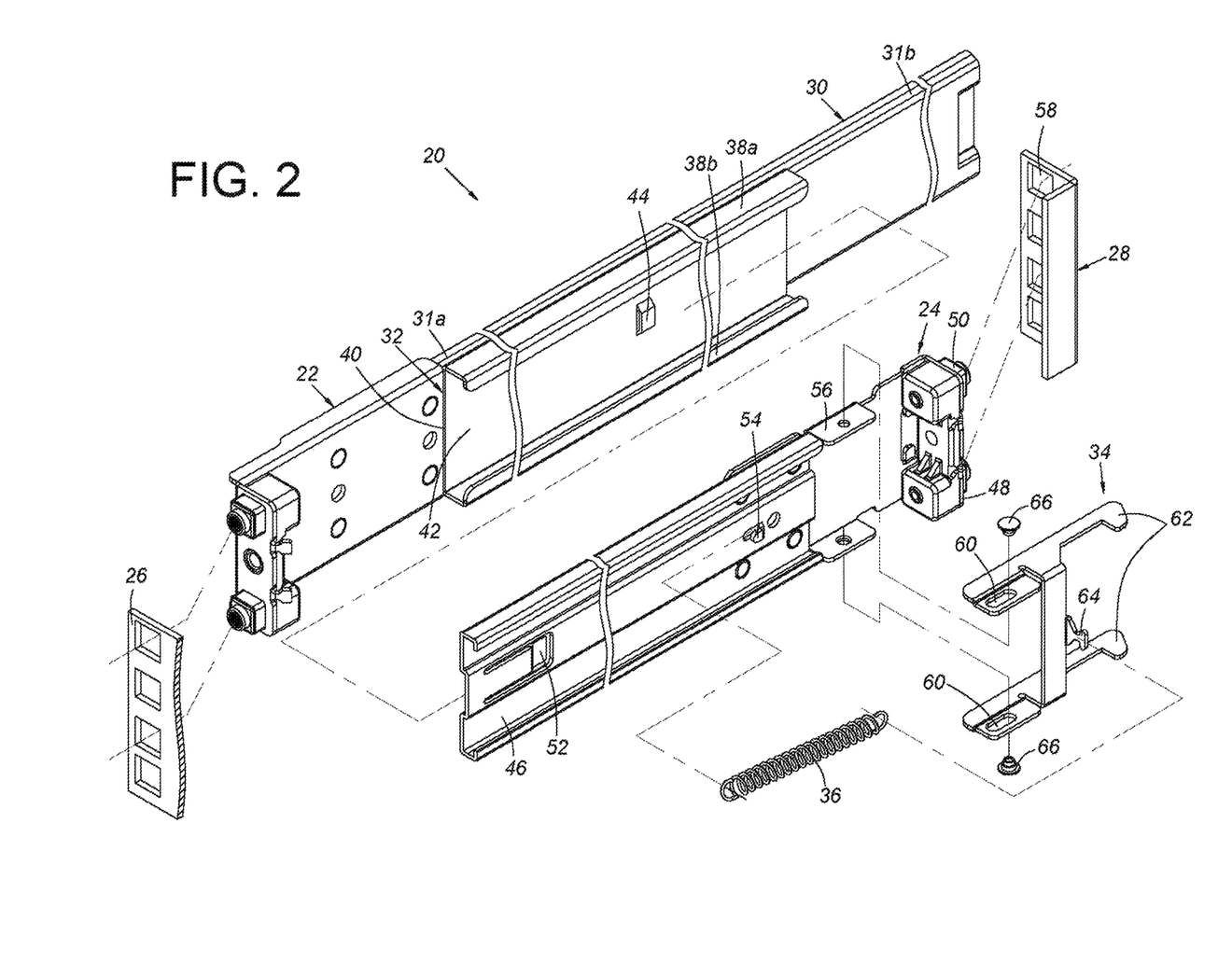
FIG. 2 is an exploded perspective view of the slide rail assembly in an embodiment of the present invention.

The slide rail assembly 20, as shown in FIG. 2, further includes a rail member 30, a supporting frame 32, a blocking member 34, and an elastic member 36. The supporting frame 32 is fixedly connected to the rail member 30 and can be viewed as a part of the rail member 30. Alternatively, the supporting frame 32 and the rail member 30 can be directly formed as a single unit. The supporting frame 32 has an upper wall 38a, a lower wall 38b, and a longitudinal wall 40 connected between the upper wall 38a and the lower wall 38b. The upper wall 38a, the lower wall 38b, and the longitudinal wall 40 jointly define a channel 42. The longitudinal wall 40 includes a first portion 44 (e.g., a protruding block) provided in the channel 42.

The first bracket 22 is mounted to the rail member 30 at a position adjacent to a first end portion 31a of the rail member 30. The second bracket 24 is movably connected to the rail member 30 and can be moved along the rail member 30 to a position adjacent to a second end portion 31b of the rail member 30. More specifically, the second bracket 24 includes a side plate 46, an end plate 48, and at least one attaching member 50. At least a portion of the side plate 46 is movably mounted to the rail member 30, e.g., movably mounted in the channel 42 of the supporting frame 32. The side plate 46 includes a second portion 52 corresponding to the first portion 44 of the supporting frame 32, a first connecting feature 54 (e.g., a projection), and at least one ear 56 extending from and bent generally with respect to the side plate 46. The end plate 48 is generally perpendicularly connected to the side plate 46. The at least one attaching member 50 is mounted to the end plate 48 and is configured to be attached to a hole 58 in the second post 28.

The blocking member 34 is movably connected to the second bracket 24. More specifically, the blocking member 34 includes a pair of guiding portions 60, a pair of blocking portions 62, and a second connecting feature 64 (e.g., a projection). In this embodiment, the pair of guiding portions 60 are longitudinal slots by way of example. Furthermore, the slide rail assembly 20 includes a pair of connecting members 66, each having a portion extending through the corresponding guiding portion 60 and the corresponding ear 56 so as to movably connect the blocking member 34 to the second bracket 24, thereby enabling displacement of the blocking member 34 with respect to the second bracket 24. The elastic member 36 is connected between the first connecting feature 54 of the second bracket 24 and the second connecting feature 64 of the blocking member 34. In another embodiment, the pair of guiding portions 60 are alternatively disposed on the second bracket 24.

Figure 3:
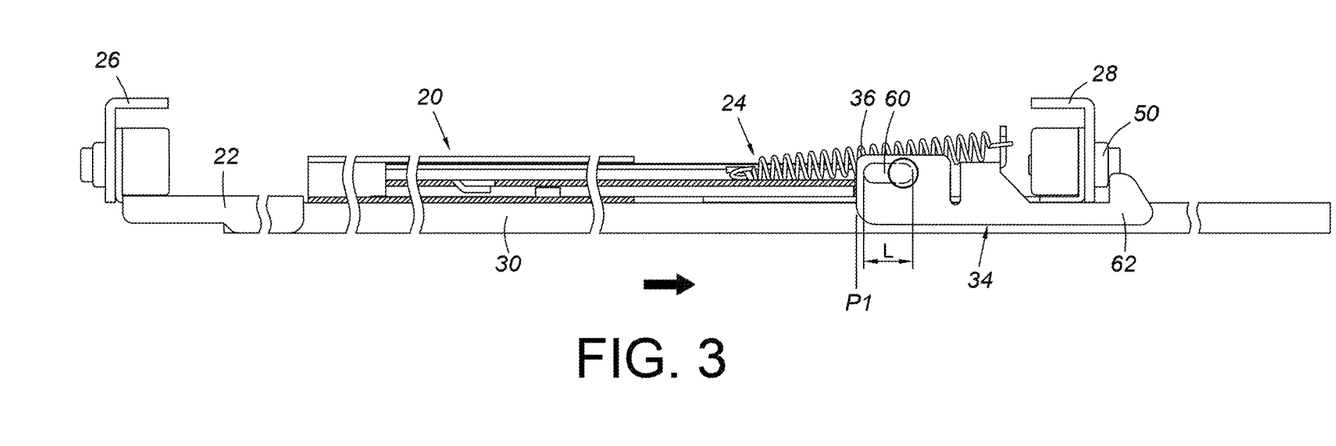
FIG. 3 shows how the slide rail assembly in an embodiment of the present invention is attached to the two posts.

Referring to FIG. 3, the second bracket 24 is attached to the second post 28 via the at least one attaching member 50, with the blocking portions 62 of the blocking member 34 corresponding to the end plate 48 of the second post 28. Each guiding portion 60 has a predetermined length L (e.g., a predetermined longitudinal length) in order to limit displacement of the second bracket 24 with respect to the blocking member 34. The second bracket 24 is kept at a first position P1 with respect to the blocking member 34 by the elastic force of the elastic member 36.

Figure 4:
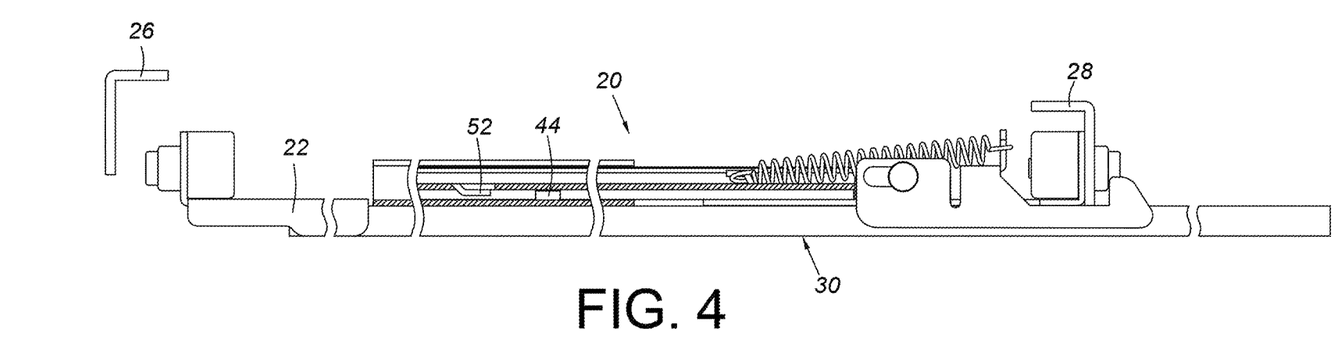
FIG. 4 shows how the first bracket of the slide rail assembly in FIG. 3 is detached from the first post.

When it is desired to detach the slide rail assembly 20 from the rack, referring to FIG. 3 and FIG. 4, the operator can do so by standing near the first post 26, releasing the lock between the first bracket 22 and the first post 26 (the locking mechanism not shown), and applying a force to the rail member 30 in a certain direction (indicated by the arrow in FIG. 3) to displace the first bracket 22 and the rail member 30 in that direction and thereby separate the first bracket 22 and the rail member 30 from the first post 26.

Figures 5, 5A, 6A:
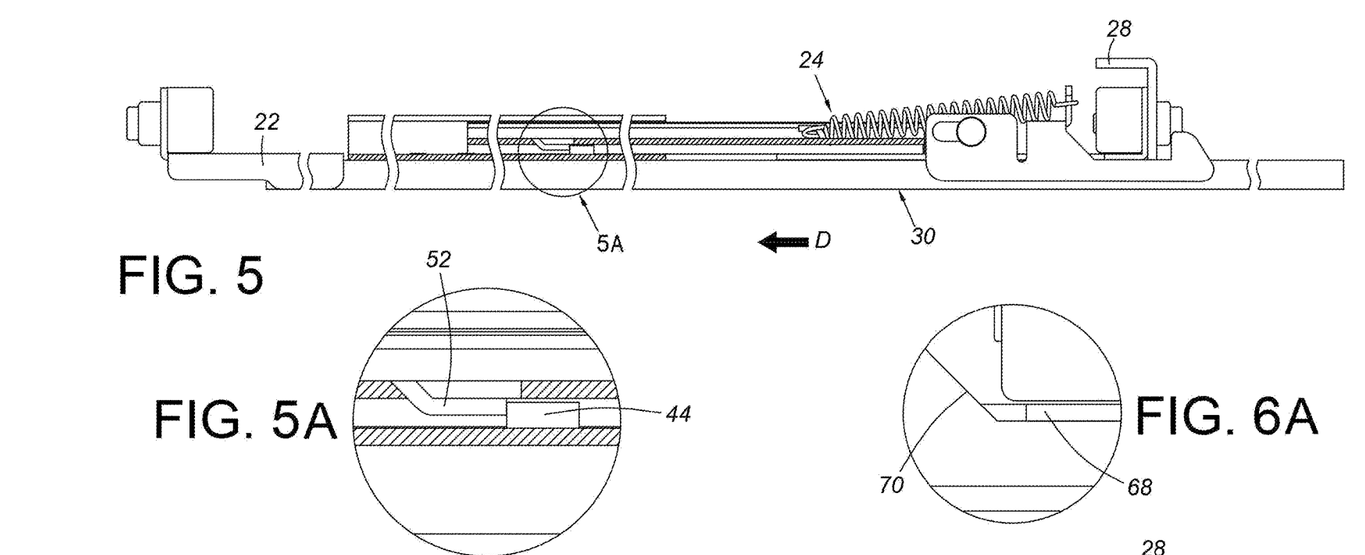
FIG. 5 shows how the second bracket of the slide rail assembly in FIG. 4 is displaced in a certain direction along with the rail member.
FIG. 5A is an enlarged view of the circled area 5A in FIG. 5, showing the first portion of the longitudinal wall of the rail member pressed against the second portion of the second bracket.
FIG. 6A is an enlarged view of the circled area 6A in FIG. 6, showing that the blocking member has a second contact portion corresponding to the first contact portion of the second bracket.
Figure 6:
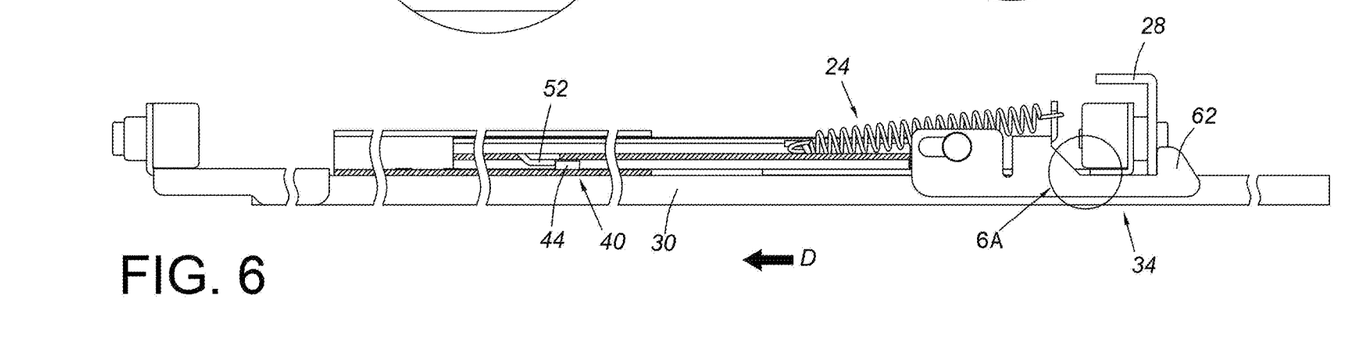
FIG. 6 shows how the second bracket in FIG. 5 is further displaced in the same direction, with the blocking portions of the blocking member pressed against the second post.

Once the first bracket 22 is separated from the first post 26, referring to FIG. 5 and FIG. 5A, the operator is required to apply another force to the rail member 30, this time in a direction D, so that the rail member 30 is displaced in this direction. When reaching a certain position, the rail member 30 begins to move the second bracket 24. In this embodiment, the rail member 30 drives the second bracket 24 by the first portion 44 of the longitudinal wall 40, which first portion 44 is in this state pressed against the second portion 52 of the second bracket 24. As a result, the second bracket 24 is displaced in the direction D until the blocking portions 62 of the blocking member 34 are pressed against the second post 28. Preferably, referring to FIG. 6 and FIG. 6A, a portion of the side plate 46 of the second bracket 24 has a first contact portion 68, the blocking member 34 has a second contact portion 70 corresponding to the first contact portion 68 of the second bracket 24, and one of the first contact portion 68 and the second contact portion 70 has a guiding surface. In this embodiment, for example, the second contact portion 70 has an inclined guiding surface.

Figure 7:
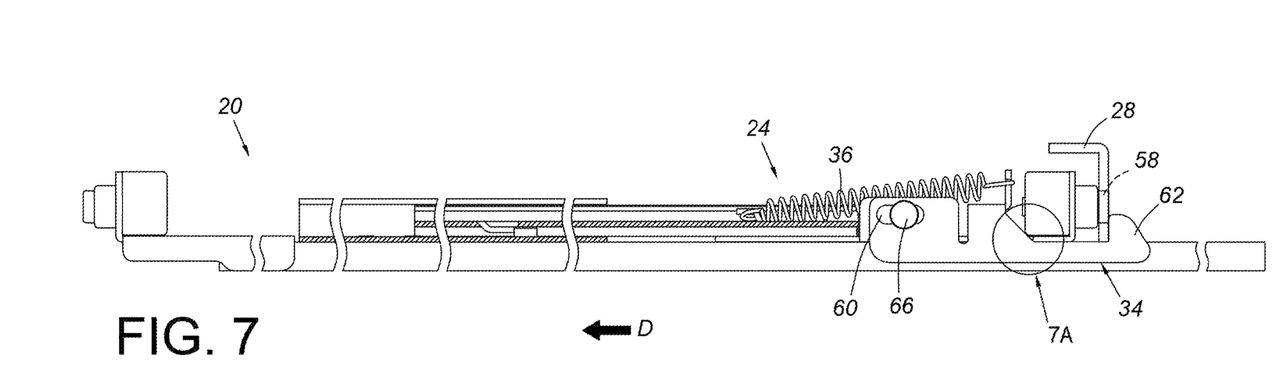
FIG. 7 shows how the second bracket in FIG. 6 is further displaced in the same direction, with a portion of the second bracket pushing the blocking member.
Figure 7A:
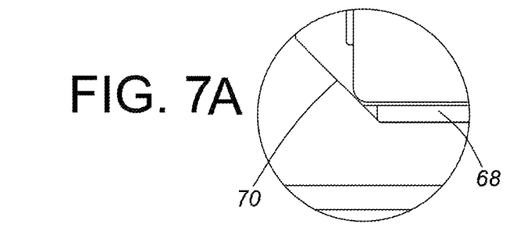
FIG. 7A is an enlarged view of the circled area 7A in FIG. 7, showing contact between the first contact portion and the second contact portion.
Figure 8:
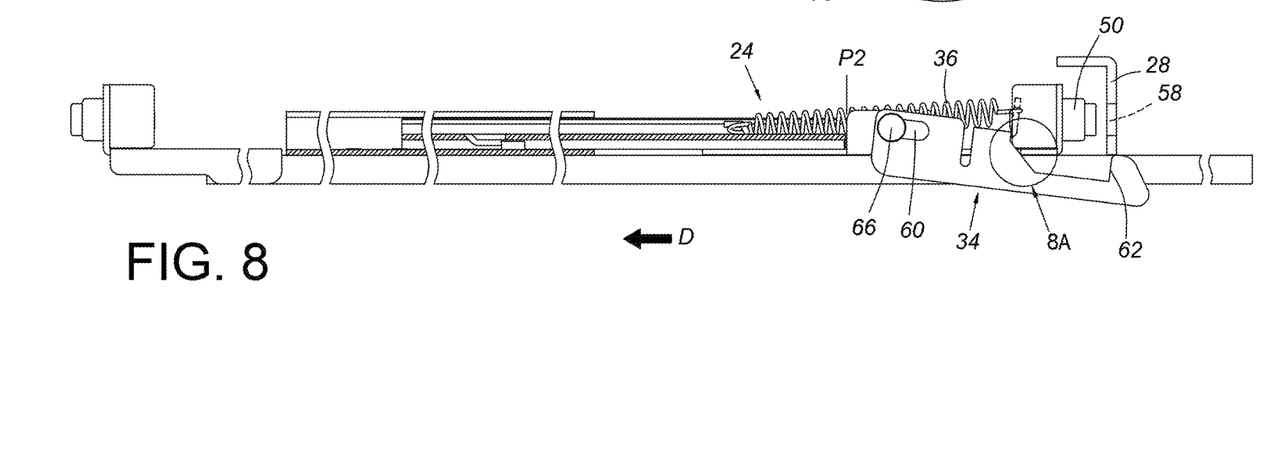
FIG. 8 shows the second bracket in FIG. 7 reaching a certain position with respect to the blocking member such that the blocking member is tilted by an angle with respect to the second bracket.
Figure 8A:
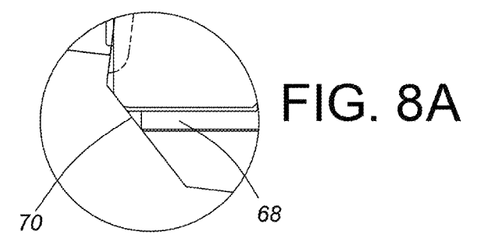
FIG. 8A is an enlarged view of the circled area 8A in FIG. 8, showing the first contact portion pressed against the second contact portion.

When the second bracket 24 is further displaced in the direction D and reaches a second position P2, referring to FIG. 7 and FIG. 8, the at least one attaching member 50 of the second bracket 24 is separated from the hole 58 of the second post 28. During the process, the first contact portion 68 of the second bracket 24 pushes the second contact portion 70 of the blocking member 34 (as can be seen more clearly in FIG. 7A and FIG. 8A) such that the blocking member 34 is tilted by an angle with respect to the second bracket 24 and is no longer pressed against the second post 28, allowing the slide rail assembly 20 to separate from the second post 28. It is worth mentioning that, while the second bracket 24 is displaced to the second position P2, the elastic member 36 stores an elastic force in response to displacement of the second bracket 24. Therefore, as soon as the slide rail assembly 20 is detached from the rack, the second bracket 24 returns to the first position P1 from the second position P2 in response to the elastic member 36. According to the above, the operator can detach the slide rail assembly 20 from the first post 26 and the second post 28 of the rack while standing near the first post 26, and the entire operation can be rapidly completed with ease.

Figure 9:
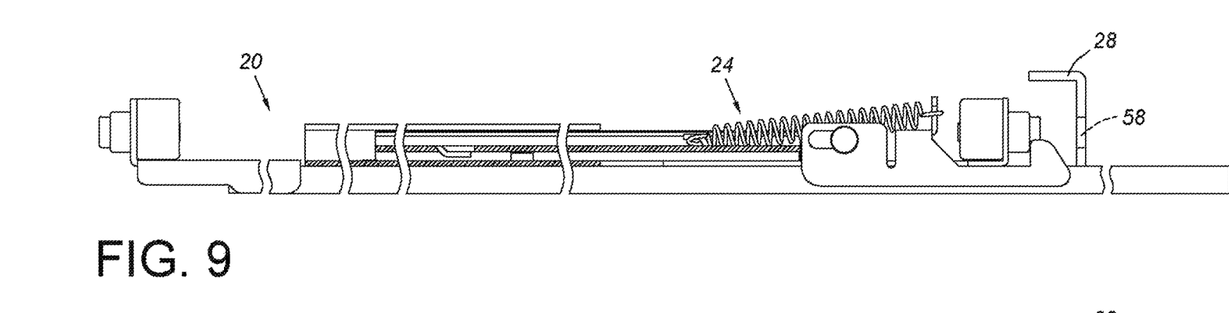
FIG. 9 shows the second bracket of the slide rail assembly in FIG. 8 ready to be reattached to the second post.
Figure 10:
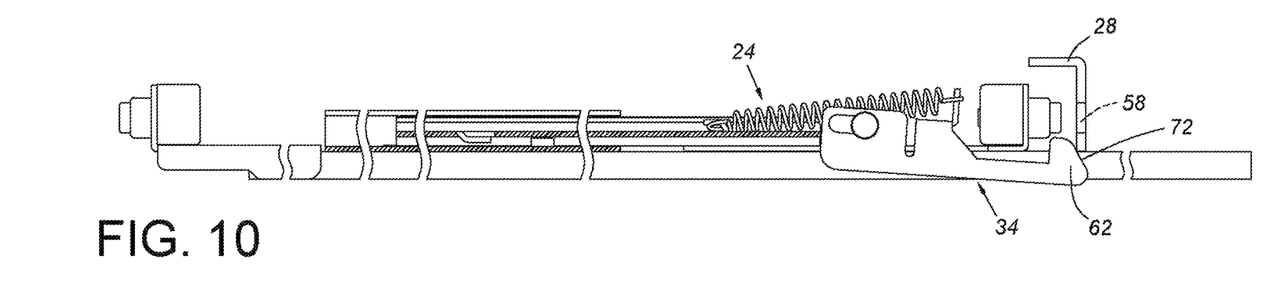
FIG. 10 shows initial contact between the second bracket of the slide rail assembly in FIG. 9 and the second post.
Figure 11:
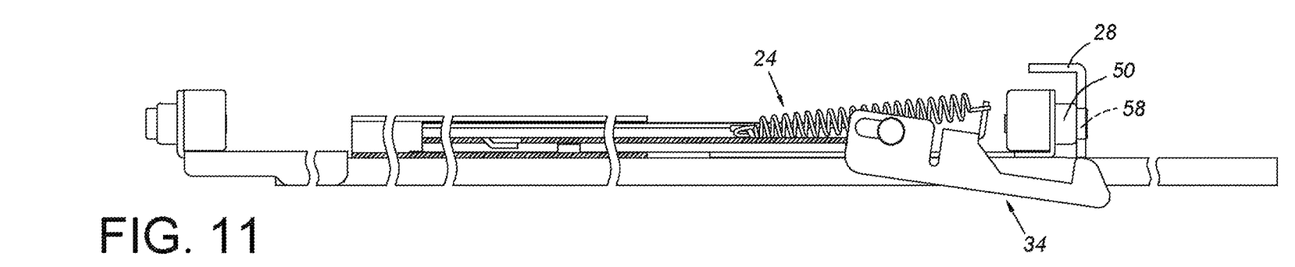
FIG. 11 shows further contact between the second bracket of the slide rail assembly in FIG. 10 and the second post.

When it is desired to reattach the slide rail assembly 20 to the second post 28 of the rack, referring to FIG. 9, FIG. 10, and FIG. 11, the operator stands near the first post 26 and displaces the second bracket 24 toward the second post 28 in order to press an inclined surface 72 of each blocking portion 62 of the blocking member 34 against the second post 28, thereby tilting the blocking member 34 by an angle with respect to the second bracket 24. Then, the at least one attaching member 50 of the second bracket 24 can be attached to the hole 58 of the second post 28 to conclude the reattaching operation.

While the present invention has been disclosed by way of the preferred embodiment described above, it is understood that the embodiment is not intended to be restrictive of the invention. The scope of patent protection sought by the applicant is defined by the appended claims.

What is claimed is:

1. A slide rail assembly for attachment to a first post and a second post of a rack, the slide rail assembly comprising:
    a rail member;
    a first bracket configured to be detachably attached to the first post of the rack;
    a second bracket configured to be detachably attached to the second post of the rack and being movably mounted to the rail member;
    a blocking member movably connected to the second bracket; and
    an elastic member providing an elastic force to thereby resiliently bias the second bracket to stay at a first position with respect to the blocking member;
    wherein responsive to the rail member being displaced in a direction subsequent to detachment of the first bracket from the first post, the second bracket is displaced in the direction along with the rail member to be displaced from the first position to a second position with respect to the blocking member subsequent to the blocking member being pressed against the second post, the second bracket thereby being separated from the second post;
    wherein the second bracket has a first contact portion, the blocking member has a second contact portion, and the first contact portion of the second bracket is configured to push the second contact portion of the blocking member to pivotally displace and separate the blocking member from the second post.

2. The slide rail assembly of claim 1, wherein the elastic member is connected between the second bracket and the blocking member.

3. The slide rail assembly of claim 1, wherein one of the first contact portion and the second contact portion has a guiding surface for guiding the blocking member to tilt by an angle with respect to the second bracket.

4. The slide rail assembly of claim 1, wherein one of the second bracket and the blocking member has a guiding portion of a predetermined length, the blocking member is movably connected to the second bracket via a connecting member mounted to the guiding portion, and the second bracket is displaceable between the first position and the second position with respect to the blocking member according to the predetermined length via the connecting member mounted to the guiding portion.

5. The slide rail assembly of claim 1, wherein the second bracket includes a side plate movably mounted to the rail member, an end plate substantially perpendicularly connected to the side plate, and an attaching member mounted to the end plate and configured for attachment to a mounting hole of the second post.

6. A bracket device, comprising:
    a bracket;
    a blocking member movably connected to the bracket, the blocking member having an elongated guiding portion of a predetermined length; and
    a connecting member extending through the guiding portion and thereby connecting the bracket and the blocking member, the bracket thereby being linearly displaceable between a first position and a second position with respect to the blocking member via the connecting member within the predetermined length of the guiding portion;
    wherein the bracket includes a side plate, an end plate substantially perpendicularly connected to the side plate, and at least one attaching member mounted to the end plate, the blocking member including a blocking portion, the blocking member being movably connected in pivotally displaceable manner to the side plate of the bracket via the connecting member extending through the guiding portion, and the blocking portion corresponding to the end plate.

7. The bracket device of claim 6, further comprising an elastic member for providing an elastic force and thereby enabling the bracket to stay at the first position with respect to the blocking member.

8. The bracket device of claim 6, wherein the bracket has a first contact portion, the blocking member has a second contact portion, and the first contact portion of the bracket is configured to push the second contact portion of the blocking member and thereby tilt the blocking member by an angle with respect to the bracket.

9. A slide rail assembly for attachment to a first post and a second post of a rack, the slide rail assembly comprising:
    a rail member;
    a first bracket configured to be detachably attached to the first post of the rack;
    a second bracket configured to be detachably attached to the second post of the rack and being movably mounted to the rail member;
    a blocking member movably connected to the second bracket; and
    an elastic member providing an elastic force to thereby resiliently bias the second bracket to stay at a first position with respect to the blocking member;
    wherein responsive to the rail member being displaced in a direction subsequent to detachment of the first bracket from the first post, the second bracket is displaced in the direction along with the rail member to be displaced from the first position to a second position with respect to the blocking member subsequent to the blocking member being pressed against the second post, the second bracket thereby being separated from the second post;
    wherein one of the second bracket and the blocking member has a guiding portion of a predetermined length, the blocking member is linearly and pivotally connected to the second bracket via a connecting member mounted to the guiding portion, and the second bracket is displaceable between the first position and the second position with respect to the blocking member according to the predetermined length via the connecting member mounted to the guiding portion.

* * * * *